(12) United States Patent
Verbruggen et al.

(10) Patent No.: US 12,191,876 B2
(45) Date of Patent: Jan. 7, 2025

(54) GAIN CALIBRATION WITH QUANTIZER OFFSET SETTINGS

(71) Applicant: Xilinx, Inc., San Jose, CA (US)

(72) Inventors: Bob Verbruggen, Dublin (IE); Christophe Erdmann, Nice (FR)

(73) Assignee: Xilinx, Inc., San Jose, CA (US)

( * ) Notice: Subject to any disclaimer, the term of this patent is extended or adjusted under 35 U.S.C. 154(b) by 196 days.

(21) Appl. No.: 18/088,982

(22) Filed: Dec. 27, 2022

(65) Prior Publication Data

US 2024/0213995 A1    Jun. 27, 2024

(51) Int. Cl.
*H03M 1/10*    (2006.01)
(52) U.S. Cl.
CPC ................................. *H03M 1/1014* (2013.01)
(58) Field of Classification Search
CPC .............................. H03M 1/10; H03M 1/1014
See application file for complete search history.

(56) References Cited

U.S. PATENT DOCUMENTS

| | | | | |
|---|---|---|---|---|
| 9,479,186 B1* | 10/2016 | Naru | ...................... | H03M 1/203 |
| 10,291,247 B1* | 5/2019 | Verbruggen | ........ | H03M 1/0836 |
| 10,298,248 B1* | 5/2019 | Vaz | .......................... | H03M 1/12 |
| 10,536,155 B1* | 1/2020 | Otte | ..................... | G06F 11/0751 |
| 2009/0140897 A1* | 6/2009 | Healy | .................... | H03M 3/484 |
| | | | | 341/139 |
| 2010/0214142 A1* | 8/2010 | Akizuki | ................ | H03M 3/356 |
| | | | | 341/143 |
| 2012/0293346 A1* | 11/2012 | Takayama | ............ | H03K 5/2481 |
| | | | | 341/110 |
| 2017/0179970 A1* | 6/2017 | Li | ........................ | H03M 1/0626 |
| 2019/0356326 A1* | 11/2019 | Liu | ...................... | H03M 1/0607 |

OTHER PUBLICATIONS

Ali et al., "A 12b 18GS/s RF Sampling ADC with an Integrated Wideband Track-and-Hold Amplifier and Background Calibration," ISSCC 2020, Session 16, NYQUIST & VCO-Based ADCs, 16.1, 3-pages, Feb. 18, 2020.

* cited by examiner

*Primary Examiner* — Lam T Mai
(74) *Attorney, Agent, or Firm* — Paradice & Li LLP

(57) ABSTRACT

Methods and apparatus for calibrating a gain for a circuit block are disclosed. An example method includes receiving a plurality of quantizer offsets, where the plurality of quantizer offsets represent calibration data for a quantizer configured to quantize an output of the circuit block, determining one or more differences based on one or more first quantizer offsets of the plurality of quantizer offsets and on one or more second quantizer offsets of the plurality of quantizer offsets, and determining an incremental change in a gain associated with the circuit block based on the one or more differences.

20 Claims, 8 Drawing Sheets

GAIN CALIBRATION WITH QUANTIZER OFFSET SETTINGS

TECHNICAL FIELD

Aspects of the present disclosure relate generally to gain calibration, and more particularly to identification of calibration errors in circuit blocks whose outputs are subject to quantization.

BACKGROUND

Digital calibration is increasingly common in analog to digital converters (ADCs) and may be performed in order to mitigate uncertainties between devices and to improve overall ADC speed, accuracy, and efficiency, particularly for high performance converters. As technology has improved, the cost of digitally detecting and mitigating non-idealities in quantizers and circuit blocks such as amplifiers has dropped significantly, while the gains of such detection and mitigation have remained substantial or even increased. For example, digital calibration may be performed for inter-stage gain, digital to analog converter (DAC) non-linearity and code-dependent unsettled charge injection, sub-ADC thresholds, inter-channel offset, gain, and timing, in addition to a variety of other contexts.

One challenge which may arise for such digital calibration is when attempting to calibrate the gain of a circuit block when the output of that same circuit block is processed by a quantizer which is itself subject to offset calibration.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to calibrating gain for a circuit block whose output is subject to quantization by a quantizer. In one aspect, a method for calibrating gain for a circuit block is disclosed, including receiving a plurality of quantizer offsets, where the plurality of quantizer offsets represent calibration data for a quantizer configured to quantize an output of the circuit block, determining one or more differences based on one or more first quantizer offsets of the plurality of quantizer offsets and on one or more second quantizer offsets of the plurality of quantizer offsets, and determining an incremental change in a gain associated with the circuit block based on the one or more differences.

In another example, a gain calibration apparatus for a circuit block is disclosed, including a first plurality of terminals to receive a plurality of quantizer offsets, the plurality of quantizer offsets representing calibration data for a quantizer configured to quantize a gain of the circuit block output, difference calculation logic configured to determine one or more differences based on one or more first quantizer offsets of the plurality of quantizer offsets and one or more second quantizer offsets of the plurality of quantizer offsets, and gain calibration logic configured to determine an incremental change in a gain associated with the circuit block based at least in part on the one or more differences.

In another example, a non-transitory computer readable storage medium is disclosed, storing instructions for execution by one or more processors of a gain calibration apparatus. Execution of the instructions by the one or more processors causes the gain calibration apparatus to perform operations including receiving a plurality of quantizer offsets, where the plurality of quantizer offsets represent calibration data for a quantizer configured to quantize an output of a circuit block, determining one or more differences based on one or more first quantizer offsets of the plurality of quantizer offsets and on one or more second quantizer offsets of the plurality of quantizer offsets, and determining an incremental change in a gain associated with the circuit block based on the one or more differences.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

Aspects of the present disclosure may calibrate a gain of a circuit block based on calibrated offsets from a quantizer coupled to an output of said circuit block. This may enable accurate and concurrent calibration of said circuit block and the quantizer. Aspects of the present disclosure may ensure that both the gain block and the quantizer are appropriately calibrated, and may avoid problems with conventional calibration circuits, where errors due to incorrect quantizer offsets and errors due to incorrect gain are not readily distinguishable. Thus, use of the example implementations may allow for the avoidance of the penalties in speed, noise, or power consumption by the quantizer due to the increased offset calibration range required using conventional techniques. As discussed in more detail below, the example implementations may allow for calibration of the gain to be performed based on information from the quantizer offset calibration results.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
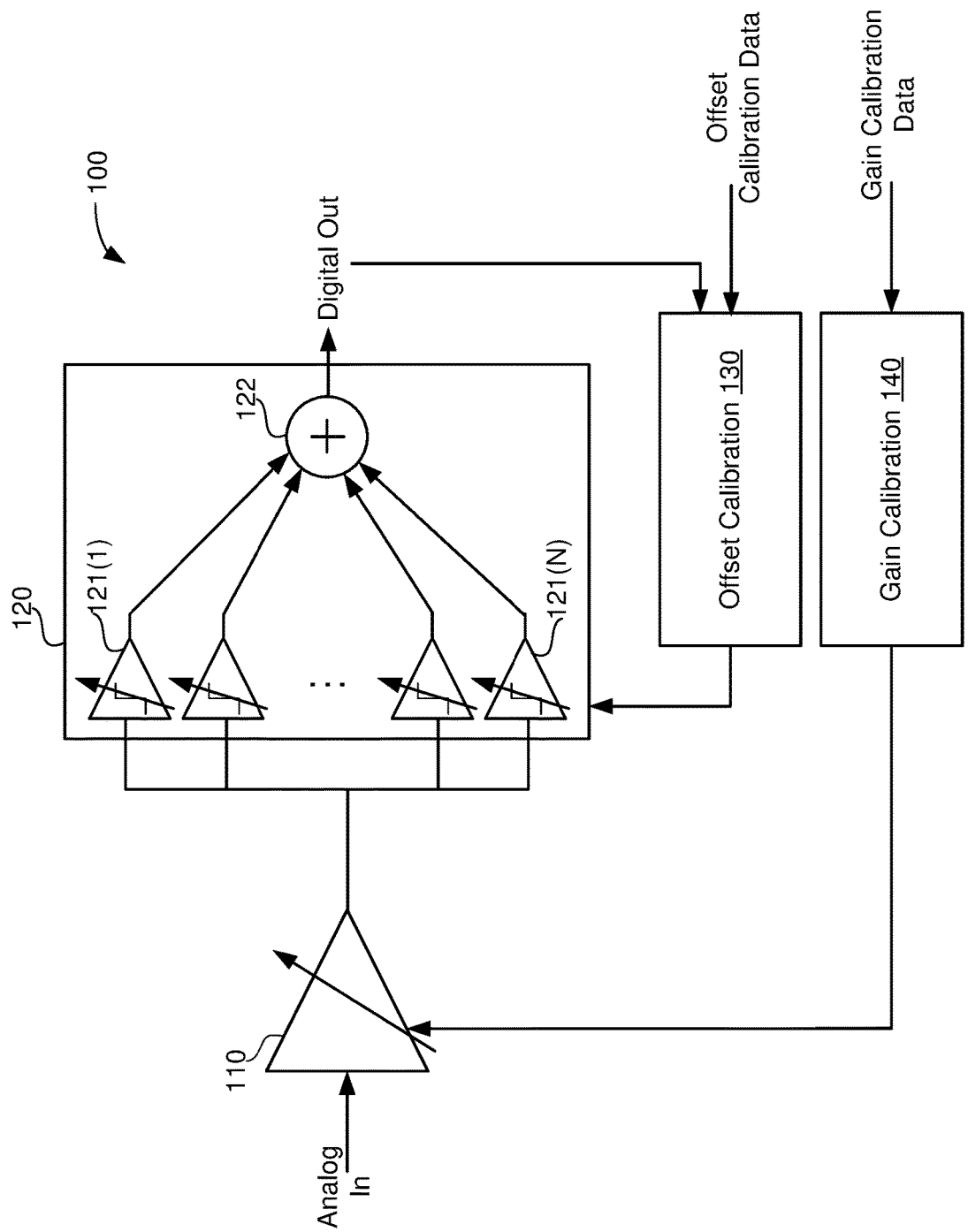
FIG. 1 is a simplified diagram of a quantized gain circuit block.

FIG. 1 is a simplified diagram of a quantized gain circuit block 100. The quantized gain circuit block 100 may receive an analog input at a circuit gain block 110. Such a circuit gain block 110 may be or include an amplifier. The output of the circuit gain block 110 may be quantized using a quantizer 120. The quantizer 120 may quantize an output of the circuit gain block 110 to one of N+1 values, indicated by the comparators 121(1)-121(N) (collectively the "comparators 121"). For example, each comparator 121 (i) may determine when the circuit gain block output is above or below a quantizer threshold and output a logic 1 or 0 value corresponding to the determination. The outputs of the comparators 121 may be summed at a summer 122, which may output a digital output representing the quantized output of the circuit gain block 110. Note that the structure of the quantizer 120 is but one example of a structure of a suitable quantizer for use with the example implementations, and that the quantizer 120 may have any suitable structure.

In order for the quantized gain circuit block 100 to function appropriately, the gain of the circuit gain block 110 and the quantizer offsets of the quantizer 120 should be appropriately calibrated. For example, appropriate calibration may ensure that the quantized outputs of the circuit gain block 110 are consistently and accurately determined. For example, the output of the quantizer 120 may be provided to offset calibration circuit 130, optionally in addition to other offset calibration data such as quantization results of succeeding stages. For example, the offset of quantizer element 121(1) may be adjusted downwards if its own output had indicated that the input was below its threshold but redundancy in succeeding stages determined that the input was above its desired threshold. The offset calibration circuit 130 may provide calibration data for configuring the quantizer 120, such as by providing offsets to one or more of the comparators 121. These offsets may affect the quantized values which may be output from the quantizer 120.

In addition to calibration of the quantizer 120, a gain of the circuit gain block 110 may be calibrated, for example, to correct gain error which may be present due to errors in a voltage reference supplied to the circuit gain block 110, due to nonideal gain in an analog signal chain preceding the circuit gain block 110, and so on. The gain of the circuit gain block 110 may be calibrated using gain calibration circuit 140, which may receive gain calibration data, such as the quantizer digital outputs, and provide gain calibration data, such as a gain or an incremental change in gain, to the circuit gain block 110.

Figure 2:
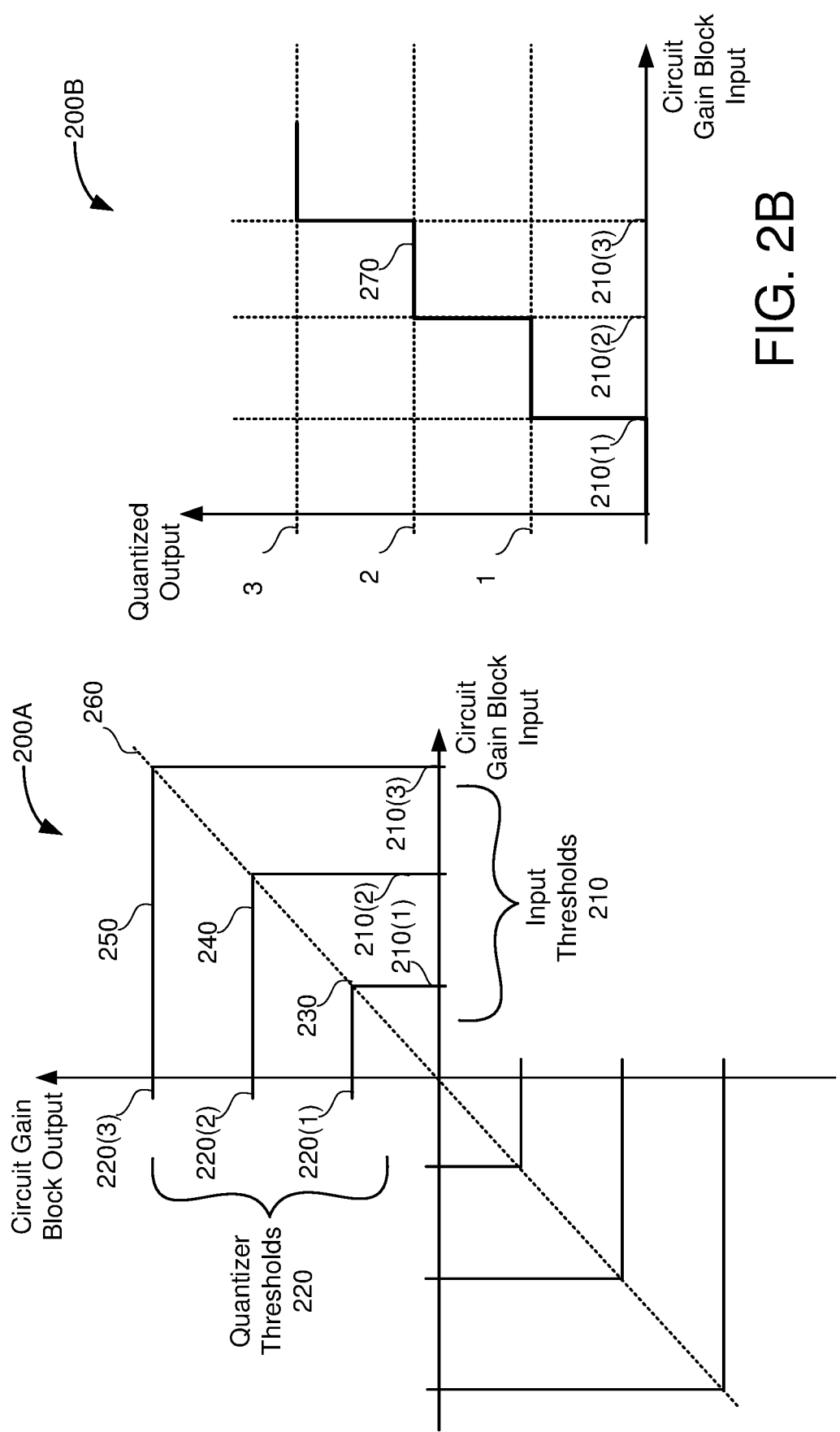
FIG. 2A shows a graph depicting a desired relationship between the quantizer thresholds of the quantizer and the equivalent input thresholds referred to the input of the circuit gain block of FIG. 1.
FIG. 2B shows a graph depicting a relationship between inputs and outputs of the quantized circuit block of FIG. 1, according to the transfer function depicted in FIG. 2A.

FIG. 2A shows a graph 200A depicting a desired relationship between the quantizer thresholds of quantizer 120 and the equivalent input thresholds referred to the input of the circuit gain block 110 of FIG. 1. FIG. 2A shows circuit gain block input on the x axis, and its output on the y axis, in addition to a plurality of input thresholds 210 and a plurality of quantizer thresholds 220. For example, the input thresholds 210 may include input thresholds 210(1), 210(2), and 210(3). Note that the graph 200A also includes symmetric input thresholds for negative amplifier inputs, not described here for simplicity. Each of the input thresholds 210 correspond to a quantizer threshold of the quantizer thresholds 220. Thus, input threshold 210(1) corresponds to quantizer threshold 220(1) via correspondence 230, input threshold 210(2) corresponds to quantizer threshold 220(2) via correspondence 240, and input threshold 210(3) corresponds to quantizer threshold 220(3) via correspondence 250. Similarly, each of the input thresholds for negative amplifier inputs correspond to negative quantizer thresholds, again not described here for simplicity. Thus, FIG. 2A indicates the input-output transfer function for the quantized gain circuit block 100. This input-output transfer function may be characterized by a line 260 passing through each of the points (210(i), 220(i)). For example, the line 260 connects the coordinates (0,0), (210(1), 220(1)), (210(2),220(2)), and (210(3),220(3)), in addition to the corresponding points for negative input thresholds and quantizer thresholds (e.g., passing through (210(−1), 220(−1)), etc.). When properly calibrated, this line 260 may have a specified slope. For example, in some aspects this slope may be one, indicating that the input thresholds equal the corresponding quantizer thresholds, that is, 210(1) may equal 220(1), and so on.

FIG. 2B shows a graph 200B depicting a relationship between inputs and outputs of the quantized circuit block 100, according to the transfer function depicted in FIG. 2A. More particularly, FIG. 2B shows that for amplifier inputs between 0 and input threshold 210(1), an output 270 of the quantizer 120 is zero, between input thresholds 210(1) and input threshold 210(2), the output 270 is 1, between input thresholds 210(2) and input threshold 210(3), the output 270 is 2, and for amplifier inputs greater than input threshold 210(3), the output 270 is 3. The output 270 is not depicted in FIG. 2B for negative amplifier inputs for simplicity, but is readily apparent from FIG. 2A, such that negative amplifier inputs correspond to −1, −2. −3 and −4 in FIG. 2A.

Note that the number of input thresholds 210 and quantizer thresholds 220 depicted with respect to FIGS. 2A-2B are kept to a limited number for simplicity only, and that in practice systems may include any number of input thresholds and quantizer thresholds without departing from the scope of the present disclosure.

Figure 3:
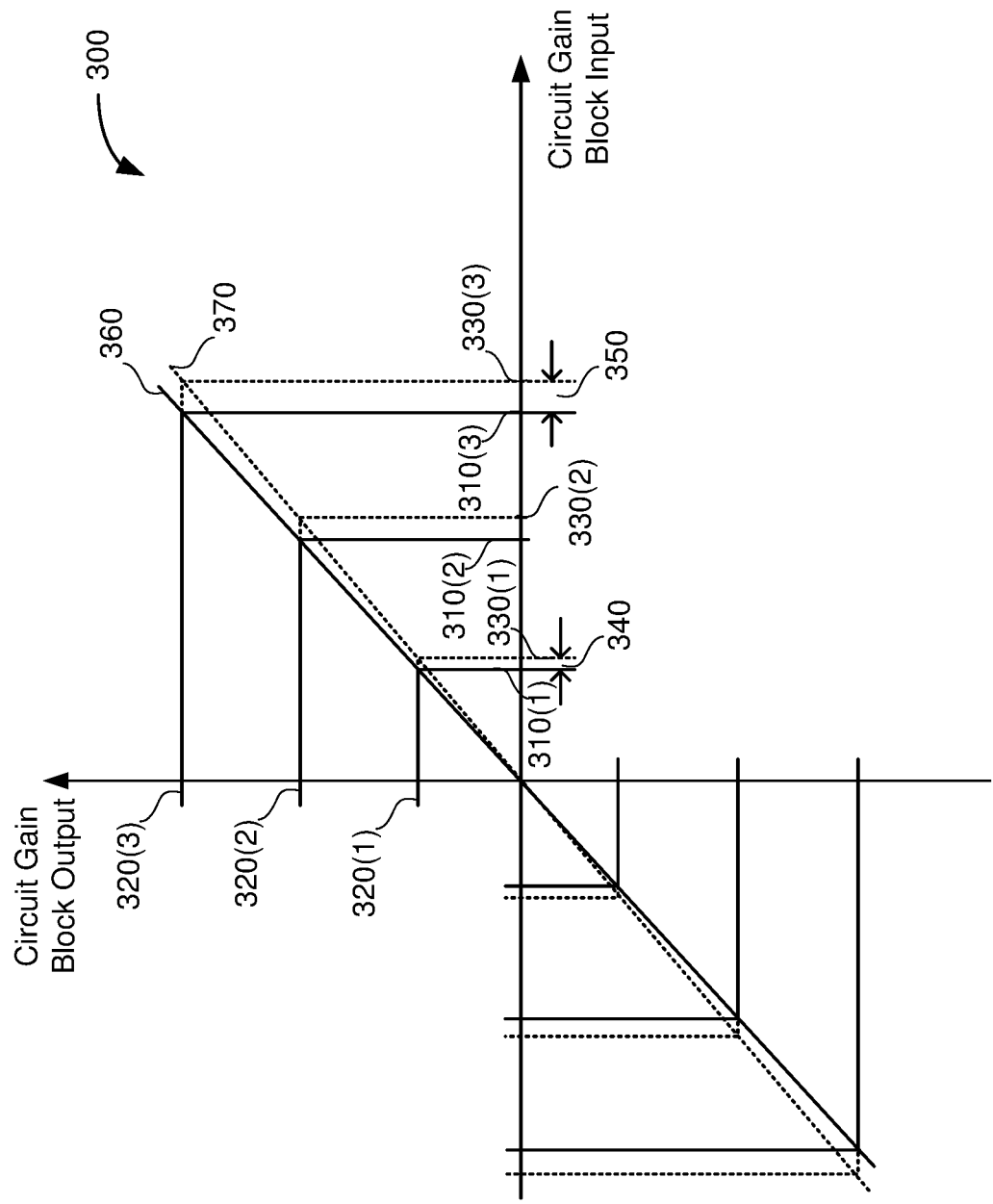
FIG. 3 shows a graph depicting a relationship between inputs to the amplifier and quantized outputs of the quantizer of FIG. 1 when gain error is present in calibration of the circuit gain block.

FIG. 3 shows a graph 300 depicting a relationship between inputs to the amplifier 110 and quantized outputs of the quantizer 120 when gain error is present in calibration of the circuit gain block 110. More particularly, while the quantizer thresholds 320(1), 320(2), and 320(3) are as desired in FIG. 3, the input thresholds are shifted. For example, input thresholds 310(1), 310(2) and 310(3) may be the desired input thresholds. However, instead of the desired input thresholds 310, due to gain error, the quantized gain circuit block 100 may exhibit shifted input thresholds 330. Rather than desired input threshold 310(1), the system may exhibit shifted input threshold 330(1), where shifted input threshold 330(1) is larger than desired input threshold 310

(1) by a first shift 340. In other words, because the gain is undesirably low, the circuit gain block input must become larger than the desired input threshold for its output to reach the corresponding quantizer threshold. Similarly, instead of desired input threshold 310(3), the system exhibits shifted input threshold 330(3), shifted by a second shift 350. As a consequence, outputs of the quantized gain circuit block 100 may be incorrect for amplifier inputs between each desired input threshold 310 and its corresponding shifted input threshold 330 because the gain of the circuit gain block 110 is smaller than desired. This gain error may also be characterized by a change in the slope of the input-output transfer function. For example, an ideal input-output transfer function maybe characterized by a line 360 connecting the ideal input thresholds 310 to their corresponding quantizer thresholds 320, as discussed above. However, the gain error may change the slope of this transfer function, resulting in a line 370 connecting the shifted input thresholds 330 to the corresponding quantizer thresholds 320.

Figure 4:
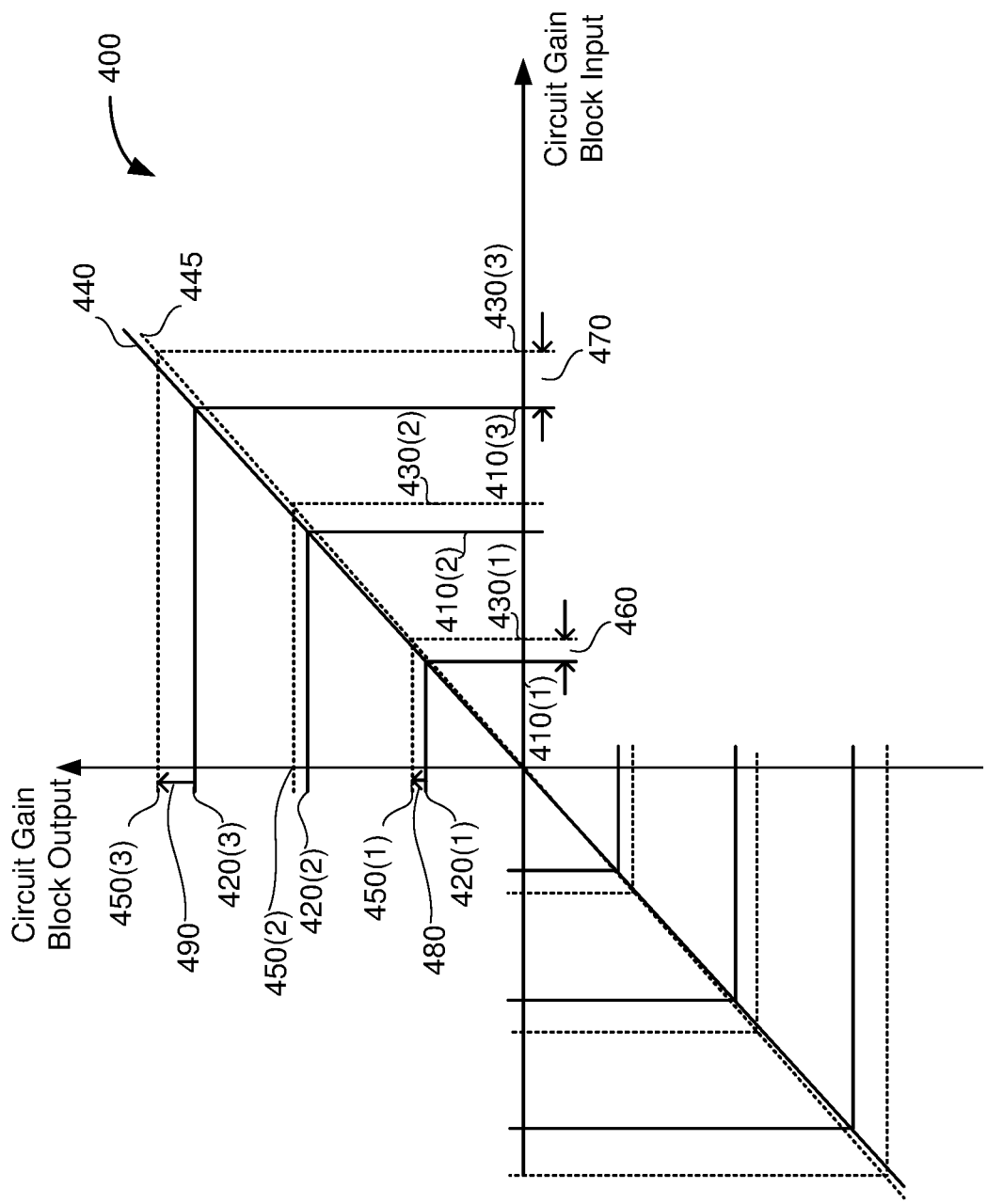
FIG. 4 shows a graph depicting a relationship between inputs to the circuit gain block and quantized outputs of the quantizer of FIG. 1 when quantizer offset error is present.

FIG. 4 shows a graph 400 depicting a relationship between inputs to the circuit gain block 110 and quantized outputs of the quantizer 120 when a particular pattern of quantizer offset error is present. More particularly, while the gain settings of the circuit gain block 110 are correctly determined, errors are present in the quantization thresholds. More particularly, the quantizer thresholds are increased with respect to the desired quantizer thresholds for positive circuit gain block outputs and decreased for negative ones. For example, the desired quantizer thresholds are depicted as quantizer thresholds 420(1), 420(2), and 420(3), but due to calibration or mismatch errors, the quantizer thresholds are increased with respect to the desired quantizer thresholds 420. Instead of desired quantizer thresholds 420(1), 420(2), and 420(3), the system exhibits respective shifted quantizer thresholds 450(1), 450(2), and 450(3). Each shifted quantizer threshold 450 is increased as compared to its corresponding desired quantizer threshold 420. For example, shifted quantizer threshold 450(1) is a shift 480 larger than the desired quantizer threshold 420(1), and shifted quantizer threshold 450(3) is a shift 490 larger than the desired quantizer threshold 420(3). Because the quantizer thresholds are shifted, so too are the circuit gain block inputs which correspond to these quantizer thresholds. For example, because the shifted quantizer threshold 450(1) is a shift 480 greater than the desired quantizer threshold 420(1), the corresponding shifted input threshold 430(1) is a shift 460 greater than the desired input threshold 410(1). Similarly, the shifted input threshold 430(3) is a shift 470 greater than the desired input threshold 410(1) as a result of the shifted quantizer threshold 450(3) being a shift 490 greater than the desired quantizer threshold 420(3).

Similarly to the gain error associated with FIG. 3, the quantizer offset error may also be characterized by a change in the slope of the input-output transfer function. For example, an ideal input-output transfer function maybe characterized by a line 440 connecting the ideal input thresholds 410 to their corresponding quantizer thresholds 420, as discussed above. However, the quantizer offset error may change the slope of this transfer function, resulting in a line 445 connecting the shifted input thresholds 430 to the corresponding shifted quantizer thresholds 450.

Conventional techniques for separately calibrating the quantizer offsets and the gain of the circuit gain block may result in quantizer errors and gain errors not being easily distinguishable from the outputs of the quantized gain circuit block 100. For example, while it may be readily apparent that a relationship between the circuit gain block input and the quantized output is incorrect, it is not readily distinguishable whether an incorrect amplifier gain or incorrect quantizer calibration is to blame. For example, with respect to FIGS. 3-4, it may be readily apparent that there is an error in the circuit gain block input at which the quantized output changes, but it may not be easily distinguishable whether that error is due to gain calibration error, as in FIG. 3, or quantizer offset error, as in FIG. 4. Put another way, one may readily determine that the slope of the line corresponding to the input-output transfer function is nonideal, indicating a presence of gain or quantizer error. However, one cannot readily determine which is to blame. For example, the line 370 associated with the gain error of FIG. 3 may be indistinguishable from the line 445 associated with the quantizer offset error of FIG. 4. One potential resolution to this difficulty would be to use a known offset calibration algorithm to account for variations in gain. However, such a solution would require a significant increase in the offset calibration range, in order to account for the allowed variations in the gain of the circuit gain block. Such increased offset calibration range would result in penalties to the speed of calibration, increased noise, and increased power usage by the quantizer. Further, the intrinsic gain of the circuit would effectively be uncontrolled, resulting in the requirement of additional margins to be built into the circuit, for example to ensure signal distortion or instability is avoided.

The example implementations provide methods and apparatus for correcting the gain of a circuit gain block whose output is coupled to a quantizer through the use of information in the quantizer offset calibration results, rather than the circuit outputs. The example implementations identify gain errors based on the pattern of applied offset corrections. More particularly, gain error has an opposite effect on quantizer offsets in the upper and lower halves of the quantizer's range. For example, when applied quantizer offset corrections are positive in the upper half of the quantizer range (e.g., for positive circuit gain block inputs), and negative in the lower half of the quantizer range (e.g., for negative circuit gain block inputs), then these errors may be attributed to a gain which is too high. Similarly, when negative offset corrections are found for the upper half and positive amplifier offset corrections are found for the lower half, this may indicate the gain is too low.

Figure 5:
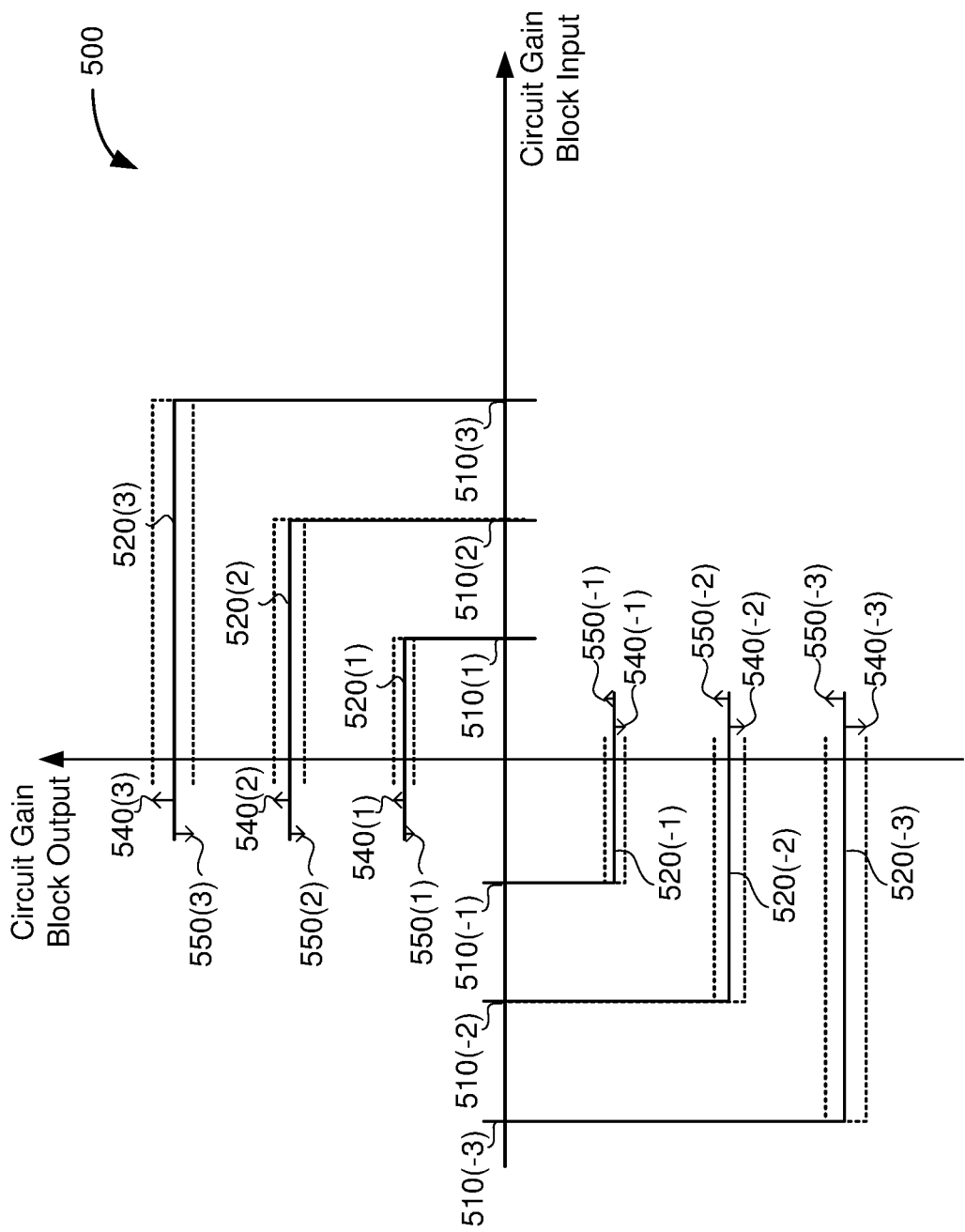
FIG. 5 is a graph depicting a pattern between quantizer offset corrections and gain error.

FIG. 5 is a graph 500 depicting a pattern between quantizer offset corrections and gain error. More particularly, FIG. 5 shows a first set of quantizer offset corrections 540 (including 540(1), 540(2), and 540(3) for positive circuit gain block inputs, and 540(−1), 540(−2), and 540(−3) for negative circuit gain block inputs) indicating an undesirably large gain, and a second set of quantizer offset corrections 550 (including 550(1), 550(2), and 550(3) for positive circuit gain block inputs, and 550(−1), 550(−2), and 550(−3) for negative circuit gain block inputs) indicating an undesirably small gain. The first set of quantizer offset corrections 540 and the second set of quantizer offset corrections 550 may be outputs from a quantizer calibration algorithm, such as employed by the offset calibration circuit 130 of FIG. 1. The input thresholds 510, including input thresholds 510(1), 510(2), and 510(3) for positive circuit gain block inputs, and 510(−1), 510(−2), and 510(−3) for negative circuit gain block inputs, may be set using such a quantizer calibration algorithm. Current values of the quantizer offsets may be given by the quantizer offsets 520, including quantizer offsets 520(1), 520(2), and 520(3) for positive circuit gain block outputs, and 520(−1), 520(−2), and 520(−3) for negative circuit gain block outputs. When the quantizer offset calibration yields the first set of quantizer offset corrections 540, gain should be reduced, while in contrast when the quantizer offset calibration yields the second set of quantizer offset corrections 550, the gain should be increased. Note that the magnitude of the offset corrections tends to increase as the magnitude of the circuit gain block output increases. That is, more correction is generally required as the circuit gain block output becomes more positive or more negative.

Aspects of the example implementations may identify when gain is too high or too low based on the pattern and magnitudes of quantizer offset corrections, and increment or decrement the gain as needed, in order to concurrently calibrate both the gain and the quantizer offsets. In some aspects, these techniques may identify when gain error causes the quantizer offset corrections to consume at least a threshold proportion of an available range of quantizer offset corrections available to the quantizer calibration algorithm and adjust the gain to reduce the likelihood of such a quantizer offset correction clipping to or past a maximum or a minimum allowed value. For example, a quantizer may have a range of allowed quantizer offset corrections of [−X:X], and the gain error may be determined based on one or more differences between the quantizer offset corrections being greater than a specified proportion of this range, such as Threshold*2X, where Threshold is a threshold percentage, or alternatively may be an integer number approximating such a specified proportion. In a more specific example, the range of allowed quantizer offset corrections may be between [−31:31], and the threshold may be 50, representing a threshold of nearly 80%.

Figure 6:
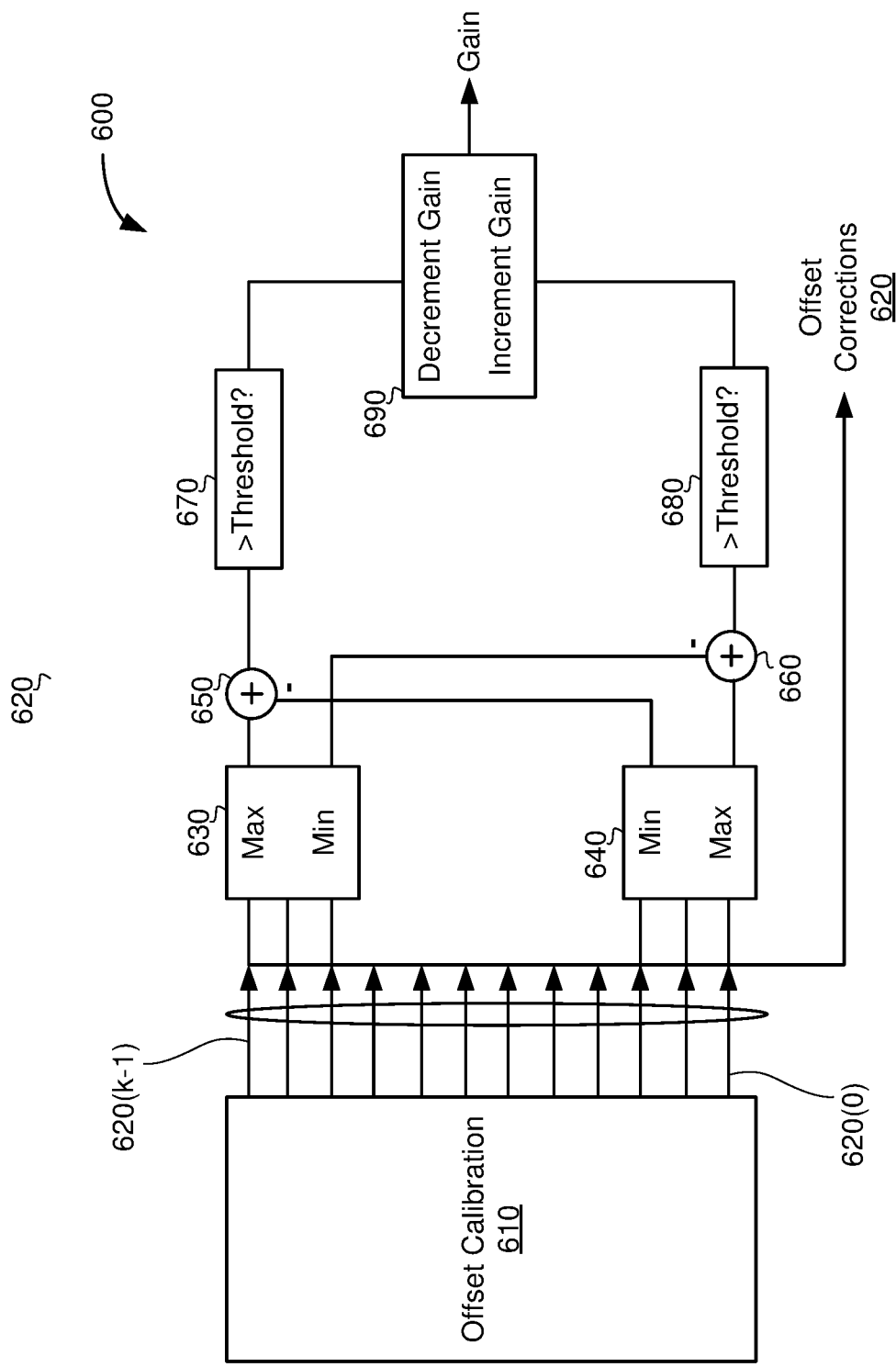
FIG. 6 shows an example gain calibration circuit, in accordance with some implementations.

FIG. 6 shows an example gain calibration circuit 600, in accordance with some implementations. FIG. 6 shows an offset calibration circuit 610 outputting a plurality of offset corrections 620, including k offset corrections indexed from 0 through k−1, where offset correction 620(0) corresponds to a most negative circuit gain block output (such as quantizer offset correction 540(−3) of FIG. 5), and offset correction 620(k−1) corresponds to a most positive circuit gain block output (such as quantizer offset correction 540(3) of FIG. 5). These offset corrections 620 may be output, for example, to calibrate a quantizer coupled to the offset calibration circuit 620, such as the quantizer 120 of FIG. 1. For example, the k offset corrections 620 may have values between −X and +X, where X may correspond to an integer power of 2, such as $(2^p-1)$ where p is an integer. In some examples, X may be 31.

N offset corrections having the largest indices, such as a top N indices may be provided to a first comparator 630. For example as shown in FIG. 6, N may be three, such that offset corrections 620(k−1), 620(k−2), and 620(k−3) are provided to the first comparator 630. The first comparator 630 may output a maximum offset correction and a minimum offset correction of the N input offset corrections having the largest indices. Similarly, N offset corrections having the smallest indices, such as a smallest N indices, may be provided to a second comparator 640. For example, when N is three, offset corrections 620(0), 620(1), and 620(2) may be provided to the second comparator 640. The second comparator may output a minimum offset correction and a maximum offset correction among these N offset corrections having the smallest indices.

A first summer 650 may compute a first difference between the maximum offset correction output from the first comparator 630 and the minimum offset correction output from the second comparator 640. First tresholder comparator 670 may compare this first difference to a threshold and provide a first output to a gain corrector 690, where the first output indicates whether or not the first difference exceeds the threshold.

A second summer 660 may compute a second difference between the maximum offset correction output from the second comparator 640 and the minimum offset correction output from the first comparator 630. Second tresholder comparator 680 may compare this second difference to the threshold and provide a second output to the gain corrector 690, where the second output indicates whether or not the second difference exceeds the threshold.

In some aspects, the threshold may correspond to a predetermined proportion of a range of allowed offset correction values, such as a proportion of the range between −X and +X. Such a proportion may be approximately 75%, 80%, 85%, or another suitable proportion of this range. For example, when X is 31, such a threshold may be 50, or roughly 80% of the range between −31 and +31.

The gain corrector 690 receives the first output and the second output and determines whether or not to apply an incremental gain correction to the gain of the amplifier. For example, when the first output indicates that the first difference exceeds the threshold, the gain corrector 690 may decrement the gain. Similarly, when the second output indicates that the second difference exceeds the threshold, the gain corrector 690 may increment the gain. If neither the first output or the second output indicate that the threshold has been exceeded by the respective first difference or second difference, then the gain may remain unchanged. In some aspects, if both the first difference and the second difference exceed the threshold, then the gain may also remain unchanged. The gain corrector 690 may output a gain correction signal configured to adjust the gain based on the respective first difference and second difference.

Figure 7:
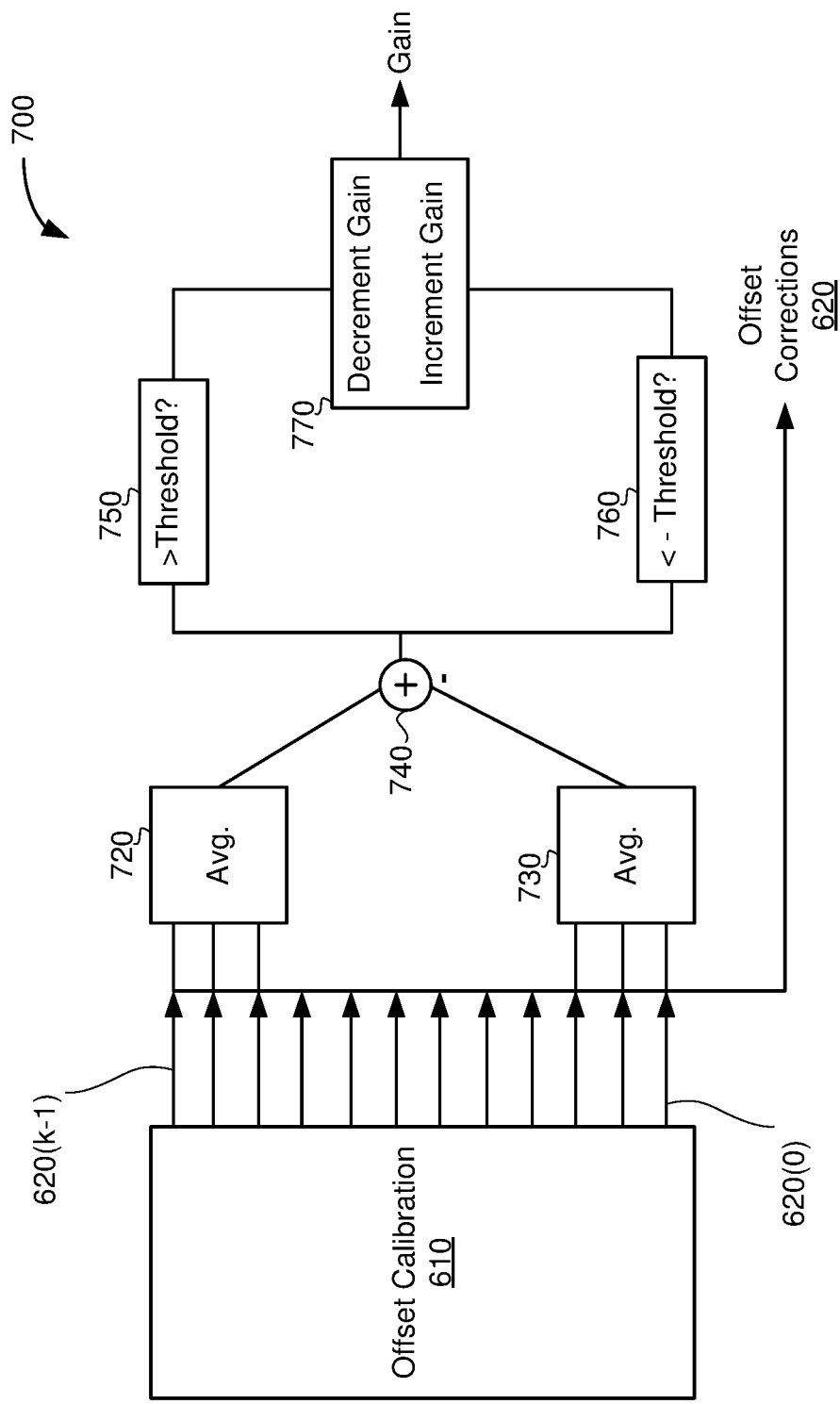
FIG. 7 shows another example gain calibration circuit, in accordance with some implementations.

FIG. 7 shows another example gain calibration circuit 700, in accordance with some implementations. Similarly to FIG. 6, the gain calibration circuit 700 includes the offset calibration circuit 610 which outputs the offset corrections 620. The offset corrections having the largest N indices may be provided to a first averager 720, which may output a first average, such as an arithmetic mean, of the N input offset corrections. For example, N may be 3, such that the inputs to the first averager 720 are offset corrections 620(k−1), 620(k−2), and 620(k−3). The offset corrections having the smallest N indices may be provided to a second averager 730, which may output a second average, such as an arithmetic mean, of the N input offset corrections. For example, N may be 3, such that the inputs to the second averager 730 are offset corrections 620(0), 620(1), and 620(2).

A summer 740 may compute a difference between the first average and the second average. A first threshold comparator 750 may compare this difference to a threshold T and provide a first output to a gain corrector 770, where the first output indicates whether or not the difference is greater than the threshold. A second threshold comparator 760 may compare this difference to −T, and determine a second output indicating whether or not the difference is less than −T. This second output is also provided to the gain corrector 770.

As described above, the threshold may correspond to a predetermined proportion of a range of allowed offset correction values, such as a proportion of the range between −X and +X. Such a proportion may be approximately 75%, 80%, 85%, or another suitable proportion of this range. For example, when X is 31, such a threshold may be 50, or roughly 80% of the range between −31 and +31. Thus, for such an example, the first output may indicate whether the difference is greater than 50, and the second output may indicate whether the difference is less than −50.

The gain corrector 770 receives the first output and the second output and determines whether or not to apply an incremental gain correction to the gain of the circuit gain block. For example, when the first output indicates that the first difference exceeds the threshold T, the gain corrector 770 may decrement the gain. Similarly, when the second output indicates that the difference is less than −T, the gain corrector 770 may increment the gain. Otherwise the gain may remain unchanged. The gain corrector 770 may output a gain correction signal configured to adjust the gain based on the respective first difference and second difference.

Figure 8:
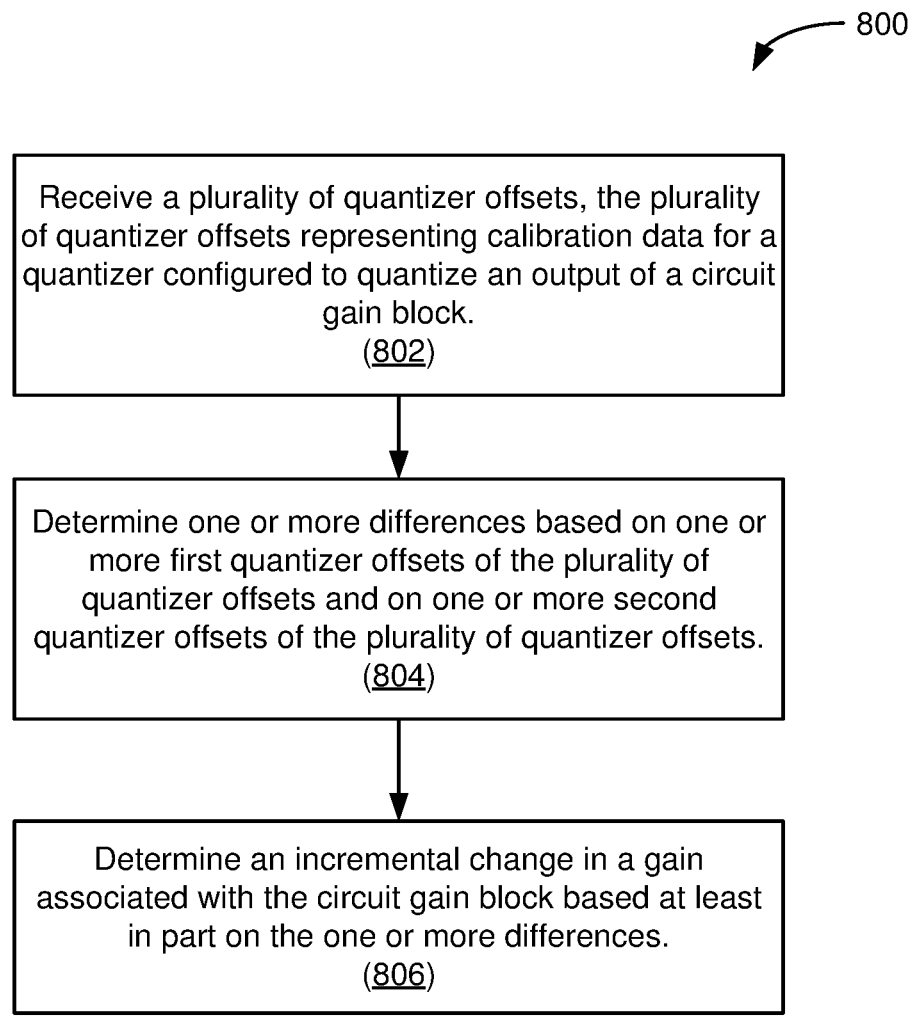
FIG. 8 is an illustrative flowchart of an operation for calibrating a gain for a circuit gain block, according to some implementations.

FIG. 8 is an illustrative flowchart of an operation 800 for calibrating a gain for a circuit gain block, according to some implementations. The operation 800 is described with respect to the gain calibration circuit 600 of FIG. 6. However, in other implementations, the operation 800 may be performed by any suitable device, such as the gain calibration circuit 700 of FIG. 7, or another suitable gain calibration circuit. Some implementations may perform the operations described herein with additional operations, fewer operations, operations in a different order, operations in parallel, and/or some operations differently.

In block 802, the gain calibration circuit 600 receives a plurality of quantizer offsets, where the plurality of quantizer offsets represent calibration data for a quantizer configured to quantize an output of a circuit gain block. In block 804, the gain calibration circuit 600 determines one or more differences based on one or more first quantizer offsets of the plurality of quantizer offsets and on one or more second quantizer offsets of the plurality of quantizer offsets. In block 806 the gain calibration circuit 600 determines an incremental change in a gain associated with the circuit gain block based at least in part on the one or more differences.

In some aspects, the one or more differences include a first difference based at least in part on a first quantizer offset corresponding to one or N most positive quantized values of the output of the circuit gain block and a second quantizer offset corresponding to one of N most negative quantized values of the output of the circuit gain block. In some aspects, the first quantizer offset is a maximum quantizer offset corresponding to one of the N most positive quantized values and the second quantizer offset is a minimum quantizer offset corresponding to one of the N most negative quantized values. In some implementations, determining the incremental change in the gain in block 806 includes decrementing the gain in response to the second difference exceeding a threshold difference. In some aspects, the one or more differences further include a second difference based at least in part on a third quantizer offset corresponding to one of the N most positive quantized values and a fourth quantizer offset corresponding to one of the N most negative quantized values. In some aspects, determining the incremental change in the gain in block 806 includes incrementing the gain in response to the second difference exceeding the threshold difference.

In some aspects, the first quantizer offset is a first average of quantizer offsets corresponding to the N most positive quantized values and the second quantizer offset is a second average of quantizer offsets corresponding to the N most negative quantized values. In some aspects, determining the incremental change in the gain in block 806 includes decrementing the gain in response to the first average exceeding the second average by at least a threshold difference. In some aspects, determining the incremental change in the gain in block 806 includes incrementing the gain in response to the second average exceeding the first average by at least the threshold difference.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of non-transitory storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method for calibrating a gain for a circuit block, comprising:
   receiving a plurality of quantizer offsets, the plurality of quantizer offsets representing calibration data for a quantizer configured to quantize an output of the circuit block;
   determining one or more differences based on one or more first quantizer offsets of the plurality of quantizer offsets and on one or more second quantizer offsets of the plurality of quantizer offsets;
   determining an incremental change in the gain based at least in part on the one or more differences.

2. The method of claim 1, wherein the one or more differences comprise a first difference based at least in part on a first quantizer offset corresponding to one of N most positive quantized values of the circuit block output and a second quantizer offset corresponding to one of N most negative quantized values of the circuit block output.

3. The method of claim 2, wherein the first quantizer offset comprises a maximum offset corresponding to one of the N most positive quantized values and wherein the second quantizer offset comprises a minimum offset corresponding to one of the N most negative quantized values.

4. The method of claim 3, wherein determining the incremental change in the gain comprises decrementing the gain in response to the first difference exceeding a threshold difference.

5. The method of claim 3, wherein the one or more differences further comprise a second difference based at least in part on a third quantizer offset corresponding to one of the N most positive quantized values and a fourth quantizer offset corresponding to one of the N most negative quantized values.

6. The method of claim 5, wherein determining the incremental change in the gain comprises incrementing the gain in response to the second difference exceeding a threshold difference.

7. The method of claim 5, further comprising making no change in the gain in response to the first difference exceeding a threshold difference and the second difference exceeding the threshold difference.

8. The method of claim 2, wherein the first quantizer offset comprises a first average of quantizer offsets corresponding to the N most positive quantized values and wherein the second quantizer offset comprises a second average of quantizer offsets corresponding to the N most negative quantized values.

9. The method of claim 8, wherein determining the incremental change in the gain comprises decrementing the gain in response to the first average exceeding the second average by at least a threshold difference.

10. The method of claim 8, wherein determining the incremental change in the gain comprises incrementing the gain in response to the second average exceeding the first average by at least a threshold difference.

11. A gain calibration apparatus for a circuit block, comprising:
- a first plurality of terminals to receive a plurality of quantizer offsets, the plurality of quantizer offsets representing calibration data for a quantizer configured to quantize an output of the circuit block;
- difference calculation logic configured to determine one or more differences based on one or more first quantizer offsets of the plurality of quantizer offsets and on one or more second quantizer offsets of the plurality of quantizer offsets; and
- gain calibration logic configured to determine an incremental change in a gain of the circuit block based at least in part on the one or more differences.

12. The gain calibration apparatus of claim 11, wherein the one or more differences comprise a first difference based at least in part on a first quantizer offset corresponding to one of N most positive quantized values of the circuit block output and a second quantizer offset corresponding to one of N most negative quantized values of the circuit block output.

13. The gain calibration apparatus of claim 12, wherein the first quantizer offset comprises a maximum offset corresponding to one of the N most positive quantized values and wherein the second quantizer offset comprises a minimum offset corresponding to one of the N most negative quantized values.

14. The gain calibration apparatus of claim 13, wherein the gain calibration logic is configured to decrement the gain in response to the first difference exceeding a threshold difference.

15. The gain calibration apparatus of claim 13, wherein the one or more differences further comprise a second difference based at least in part on a third quantizer offset corresponding to one of the N most positive quantized values and a fourth quantizer offset corresponding to one of the N most negative quantized values.

16. The gain calibration apparatus of claim 15, wherein the gain calibration logic is configured to increment the gain in response to the second difference exceeding a threshold difference.

17. The gain calibration apparatus of claim 12, wherein the first quantizer offset comprises a first average of quantizer offsets corresponding to the N most positive quantized values and wherein the second quantizer offset comprises a second average of quantizer offsets corresponding to the N most negative quantized values.

18. The gain calibration apparatus of claim 17, wherein the gain calibration logic is configured to decrement the gain in response to the first average exceeding the second average by at least a threshold difference.

19. The gain calibration apparatus of claim 17, wherein the gain calibration logic is configured to increment the gain in response to the second average exceeding the first average by at least a threshold difference.

20. A non-transitory computer readable storage medium storing instructions that, when executed by one or more processors of a gain calibration apparatus, cause the gain calibration apparatus to perform operations comprising:
- receiving a plurality of quantizer offsets, the plurality of quantizer offsets representing calibration data for a quantizer configured to quantize a circuit block output;
- determining one or more differences based on one or more first quantizer offsets of the plurality of quantizer offsets and on one or more second quantizer offsets of the plurality of quantizer offsets;
- determining an incremental change in a gain of the circuit block based at least in part on the one or more differences.

* * * * *